United States Patent
Kasík et al.

(10) Patent No.: US 11,797,792 B2
(45) Date of Patent: Oct. 24, 2023

(54) METHOD OF PROCESSING A SIGNAL OF A PASSIVE RFID CHIP WITH A READER

(71) Applicant: Y Soft Corporation, Brno (CZ)

(72) Inventors: Vladislav Kasík, Prague (CZ); Pavel Staněk, Prague (CZ)

(73) Assignee: Y Soft Corporation, Brno (CZ)

( * ) Notice: Subject to any disclaimer, the term of this patent is extended or adjusted under 35 U.S.C. 154(b) by 96 days.

(21) Appl. No.: 17/640,078

(22) PCT Filed: Sep. 3, 2020

(86) PCT No.: PCT/CZ2020/050064
§ 371 (c)(1),
(2) Date: Mar. 3, 2022

(87) PCT Pub. No.: WO2021/043348
PCT Pub. Date: Mar. 11, 2021

(65) Prior Publication Data
US 2022/0300724 A1 Sep. 22, 2022

(30) Foreign Application Priority Data
Sep. 3, 2019 (CZ) .............................. CZ2019-563

(51) Int. Cl.
*G06K 7/10* (2006.01)
*H03F 3/45* (2006.01)

(52) U.S. Cl.
CPC ..... *G06K 7/10366* (2013.01); *H03F 3/45475* (2013.01); *H03F 2200/451* (2013.01)

(58) Field of Classification Search
CPC ............ G06K 7/10366; H03F 3/45475; H03F 2200/451
(Continued)

(56) References Cited

U.S. PATENT DOCUMENTS

| 11,290,074 | B1* | 3/2022 | Omoumi | ................... H03F 3/21 |
| 2005/0195023 | A1* | 9/2005 | Alihodzic | ................ H03D 1/00 329/347 |

(Continued)

FOREIGN PATENT DOCUMENTS

| EP | 0545254 B1 | 6/1997 |
| EP | 1538546 A2 | 6/2005 |

(Continued)

OTHER PUBLICATIONS

Fernando Da Rocha Paixao Cortes, Signal Processing for UHF RFID Reader, Low-Power-Voltage analog front-end LF passive RFID tag system, Sep. 2003.

(Continued)

*Primary Examiner* — Paultep Savusdiphol
(74) *Attorney, Agent, or Firm* — Thedford I. Hitaffer; Hitaffer & Hitaffer, PLLC

(57) ABSTRACT

The subject of the invention Is a method of processing a signal of a passive RFID chip (1) with a reader (2) in order to amplify the useful signal. A method of processing a signal of a passive RFID chip (1) with a reader (2) comprising an antenna (3), an operational amplifier (4), an AD converter (5) and a first DA converter (6) and a second DA converter (7) or a source of constant voltage consists of steps of transmitting the source signal of the antenna (3), receiving the source signal of the antenna (3) by the RFID chip (1), transmitting the RFID chip (1) signal and receiving the RFID chip (1) signal by the antenna (3), wherein the received RFID chip (1) signal and the output of the first DA converter (6) is fed to the inverting input of the operational amplifier (4) and the output of the second DA converter (7) or the output of the source of constant voltage is fed to the non-inverting input of the operational amplifier (4). After converting the signal by the AD converter (5) the amplitude of two consecutive peaks belonging to a single wave is (Continued)

subtracted, wherein the individual signals are temporarily stored in the buffer (12) before subtraction.

6 Claims, 2 Drawing Sheets

(58) Field of Classification Search
USPC .......................................................... 235/451
See application file for complete search history.

(56) References Cited

U.S. PATENT DOCUMENTS

| 2008/0032655 | A1* | 2/2008 | Kawasaki | ............ | G06K 7/0008 |
| | | | | | 455/280 |
| 2009/0096520 | A1* | 4/2009 | Bas | .......................... | H03D 1/00 |
| | | | | | 329/347 |

FOREIGN PATENT DOCUMENTS

| EP | 1871062 A1 | 12/2007 |
| WO | 2004030300 A1 | 4/2004 |
| WO | 2008080758 A1 | 7/2008 |
| WO | 2014210183 A2 | 12/2014 |

OTHER PUBLICATIONS

Autor Prace, Brno University of Technology, Faculty of Electrical Engineers and Communication Department of Radio Electronics, 2015.

Visegrad Patent Institute, International Search Report dated Dec. 18, 2020.

Visegrad Patent Institute, Written Opinion dated Jan. 4, 2021.

* cited by examiner

METHOD OF PROCESSING A SIGNAL OF A PASSIVE RFID CHIP WITH A READER

CROSS-REFERENCE TO RELATED APPLICATIONS

This application, filed under 35 USC 371, is a United States National Stage Application of International Application No. PCT/CZ2020/050063, filed Sep. 3, 2020, which claims priority to CZ Application No. PV 2019-563, filed on Sep. 3, 2019, the disclosures of which are incorporated herein by reference in their entirety.

FIELD OF THE INVENTION

The invention relates a method of processing a signal of a passive RFID chip operating in the area of low frequencies (LF), most commonly the frequency 125 kHz, in order to amplify the useful signal and improve the quality of reading of LF RFID contactless cards.

BACKGROUND OF THE INVENTION

The method of contactless transfer of data based on transmitting, receiving and processing of a radio signal, also known as RFID (radio-frequency identification), is used more and more nowadays. This technology, applicable for example in identification cards for attendance records, for identification of components in device during manufacture or for contactless authorization for devices such as printers or photocopiers, uses signal transfer between a reader and a so-called tag (a card, a chip), with an integrated antenna and an integrated circuit for generating its own signal. The present solution relates to a method of processing a signal of a passive RFID chip, i.e. a chip or a card without energy source, which are fed by the electromagnetic energy from the reader. In a simplified arrangement the chip antenna receives a signal transmitted by the reader antenna and uses the received energy to power its internal integrated circuit, which starts to produce its own signal and transmits it by means of the antenna back to the reader. In practice, however, there are problems with reading contactless cards, particularly in terms of the strength of the signal. There are ways to amplify the signal by means of additional external components, but this process means considerable costs as well as higher bias. Therefore, it is desirable to provide a solution that uses a different mechanism to amplify the signal.

Solutions are known in the state of the art which use positive and negative signal values when processing a signal. Patent document WO200880758 A1 discloses a demodulator of an amplitude modulated signal—a so-called ASK demodulator, which comprises a positive and a negative branch, which allow simultaneous demodulation of a positive and negative half period signal, wherein the demodulation process is performed in these individual branches. However, this document does not disclose signal shifting by means of an operational amplifier functionally connected as a summing amplifier. A considerable disadvantage of the disclosed solution is particularly its limitation to processing just the amplitude modulated signal, wherein in the field of RFID technologies there are also devices working with a frequency (FSK) or phase (PSK) modulated signal.

European patent EP0545254 B1 further discloses an analogue-digital converter (ADC) characterized by automatic converter range control. Apart from the AD converter itself, the disclosed solution includes a peak detector, which is used for providing a reference potential on the basis of the detected signal peak amplitude, and a circuit ensuring a shift of a signal direct level while taking in account the reference potential so that the signal is in the AD converter range. In a specific example embodiment the signal shift is ensured by a sum of a half the value of the input analogue signal and a half the value of the reference potential, not using the operational amplifier. Such shifted signal is further processed by the AD converter, wherein the automatic control of the converter range is ensured by the reference potential taking a new value with every detection of a new peak. In addition, this document does not disclose a potential use of such solution in the field of RFID technologies.

The principle of signal shifting for use in a RFID reader is also published in a European patent application EP1538546 A2, which discloses a solution including a circuit for stripping a signal so that only its certain part is further processed by a reader. This circuit can be preferably used for stripping a signal, for example, around a peak. However, no operational amplifier is used to shift the signal, in contrast to the present invention, and the purpose of the solutions is also different. Signal shifting is in the mentioned patent application used for amplifying relatively small voltage deviations that comprise readable information, not for processing of the input signal for the AD converter.

At present, solutions utilizing an operational amplifier in a special connection to shift the signal are known, which allows the signal to be further processed by the AD converter also when this converter has a smaller range than the amplitude of the input signal. However, the disclosed solution, apart from the signal shifting mechanism itself for AD converter processing, does not use any combination of AD converter output values in order to amplify the useful signal and improve the quality of reading of LF RFID contactless cards.

SUMMARY OF THE INVENTION

The above-mentioned shortcomings are at least partially eliminated by a method of processing a signal of a passive RFID chip by a reader the essence of which is based on the fact that the reader comprises an antenna, an operational amplifier, an AD converter, and a first DA converter and further a second DA converter or a source of constant voltage, and that this method consists of steps of transferring of a source signal of the antenna, receiving a source signal of the antenna by the RFID chip, transferring the RFID chip signal and receiving of the RFID chip signal by the antenna, wherein the received RFID chip signal and the output of the first DA converter is fed to the inverting input of the operational amplifier, and the output of the second DA converter or the output of the source of constant voltage is fed to the non-inverting input of the operational amplifier.

The advantage of the present solution as compared to the standard method of processing a signal of an RFID chip is particularly the use of the useful signal both in the positive and in the negative half period. In order for this signal to be further processed by the AD converter, it is shifted by the operational amplifier functionally connected as a summing amplifier. To shift a signal in such a way that the AD converter processes the useful signal of a positive, or a negative, peak, a suitably set voltage ratio value DAC1 is used at the first DA converter, the output of which is fed to the inverting input of the operational amplifier, and DAC2 voltage at the second DA converter or the source of constant voltage, the output of which is fed to the non-inverting input of the operational amplifier. Calibration helps to find the first pair of values Pos1 and Pos2 of voltage of the first and the second DA converter or the source of constant voltage, wherein the values Pos1 and Pos2 are chosen in such way that the window of the operational amplifier scans the positive half wave of the received signal; and the second pair of values Neg1 and Neg2 of voltage of the first and the second DA converter or the source of constant voltage, wherein the values Neg1 and Neg2 are chosen in such way that the window of the operational amplifier scans the negative half wave of the received signal.

After converting the signal by the AD converter, when processing the buffer, the amplitudes of two consecutive peaks are subtracted, which can help to obtain a stronger signal, even without using costly additional external components, wherein such solution leads to increase in the reader sensitivity, thanks to which it is also possible to process weak signals from LF RFID cards. In a preferred embodiment the individual signals at the output of the AD converter are before subtraction temporarily stored in the buffer and the final digitally processed signal is subsequently stored in a data structure (queue) to prevent data overflow.

The effect of increasing the magnitude of the RFID chip signal is observed for all types of signal modulation (ASK, FSK and PSK; i.e. amplitude, frequency and phase), wherein another shortcoming is removed in PSK cards by this process. In standard PSK card signal transmission, different modulation of individual half waves occurs based on which side of the card is placed on the reader, leading to a different reading distance from different card sides. The present method of RFID chip signal processing can be preferably used for example for contactless authorization for devices, such as printers or photocopiers.

The reader for the above-mentioned method of processing the signal of the passive RFID chip comprises at least an antenna adapted to transmit a source signal and detect a passive RFID chip signal, a control unit electrically connected to the antenna and adapted to excite the antenna, a first DA converter and a second DA converter or a source of constant voltage, a synchronizing unit, an AD converter, and an operational amplifier. The synchronizing unit is electrically connected to the first DA converter and further to the second DA converter or the source of constant voltage, the control unit, and the AD converter and it is adapted to time synchronize all components with which it is directly and/or indirectly electrically connected. Outputs of the antenna and the first DA converter are fed to the inverting input of the operational amplifier. The output of the second DA converter or the source of constant voltage is then fed to the non-inverting input of the operational amplifier. The output of the operational amplifier is subsequently fed to the input of the AD converter, wherein the operational amplifier is connected as the summing operational amplifier.

In order for the operational amplifier to exhibit the defined behavior also outside the operation range, the input of the operational amplifier must be of a rail-to-rail type. In a preferred embodiment the output of the operational amplifier is also of the rail-to-rail type. The control unit in the preferred embodiment comprises a transistor of a push-pull MOSFET type.

DESCRIPTION OF DRAWINGS

The summary of the invention is further shown in exemplary embodiment which are described with references to the accompanying drawings, where.

EXEMPLARY EMBODIMENTS OF THE INVENTION

Figure 1:
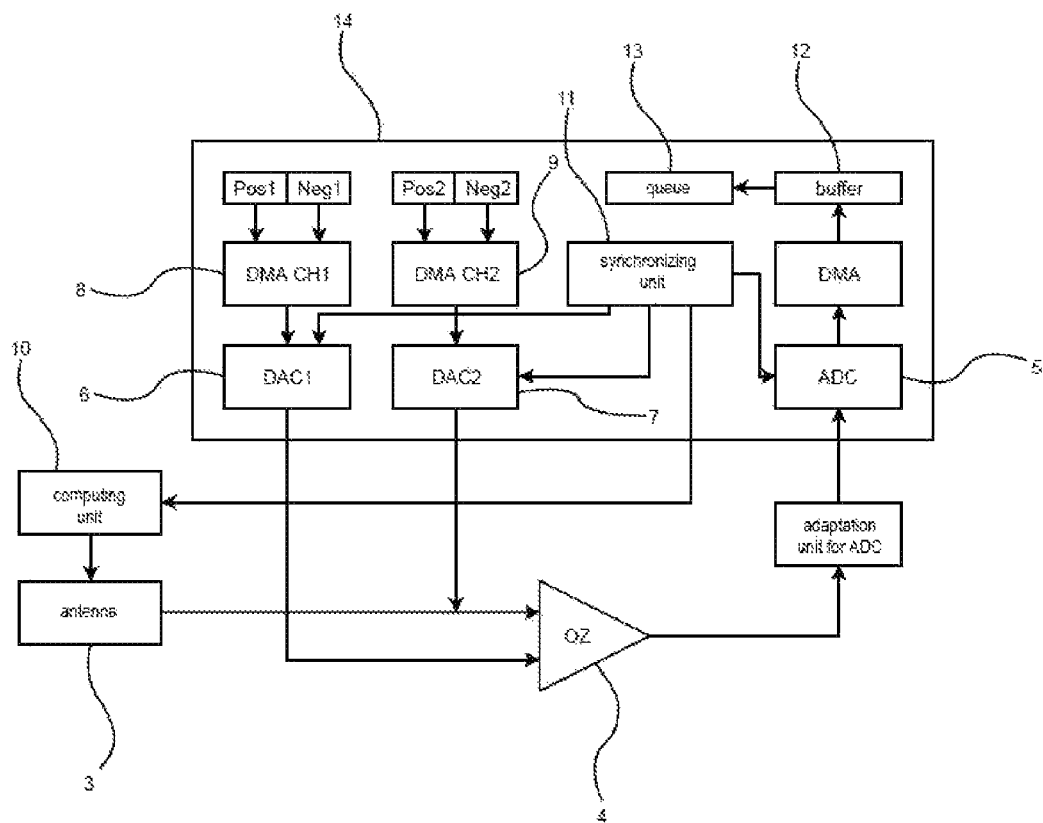
FIG. 1 shows a schematic representation of connection of a reader for performing a method of processing a signal of a passive RFID chip.

The invention will be further described by means of exemplary embodiments with references to the accompanying drawings.

A method of processing a signal of a passive RFID chip 1 by a reader 2 comprising an antenna 3, an operational amplifier 4, an AD converter 5 and a first DA converter 6 and a second DA converter 7 or a source of constant voltage consists of steps of transmitting the source signal of the antenna 3, receiving the source signal of the antenna 3 by the RFID chip 1, transmitting the RFID chip 1 signal and receiving the RFID chip 1 signal by the antenna 3, wherein the received RFID chip 1 signal and the output of the first DA converter 6 is fed to the inverting input of the operational amplifier 4 and the output of the second DA converter 7 or the output of the source of constant voltage is fed to the non-inverting input of the operational amplifier 4.

The processing of the signal of the RFID chip 1 by the reader 2 is preceded by three calibration procedures which include tuning of the antenna 3 and then further phase calibration of the reader 2 and calibration of voltage values at the output of the first DA converter 6 and the second DA converter 7 or the source of constant voltage which are connected individually to the inverting and non-inverting input of the operational amplifier 4. The tuning of the antenna 3 is performed by means of a number of external tuning condensers and is performed in such way that the antenna 3 shows the highest amplitude of the signal at the required frequency of 125 kHz. Voltage at the antenna 3 is measured by a capacitor divider for converting the voltage into the AD converter 5 range, wherein a secondary input of the AD converter 5 is used for the measurement.

Calibration of the reader 2 consists primarily in the correct determination of the phase of the input signal of the AD converter 5 relative to the phase of the synchronizing unit 11 which is necessary for processing of the signal by the AD converter 5 exactly in given extremes, i.e. in positive and negative signal peaks, since in positive and negative half waves pulses corresponding to the transferred information of the RFID chip 1 are detected.

In order to shift the signal in such way that the AD converter 5 processes the useful signal of the positive or the negative peak, a suitably set value of voltage ratio DAC1 is used at the first DA converter 6, the output of which is fed to the inverting input of the operational amplifier 4, and DAC2 voltage at the second DA converter 7 or the source of constant voltage, the output of which is fed to the non-inverting input of the operational amplifier 4. The operational amplifier 4 is connected as a summing amplifier and in the preferred embodiment the output of the operational amplifier 4 is of a rail-to-rail type. The input of the operational amplifier 4 must be of the rail-to-rail type to ensure its defined behavior even outside the operational range. The third step of the calibration process consists in finding optimum values of voltage DAC1 and DAC2, wherein specifically values Pos1 and Pos2 representing voltage DAC1 and DAC2 are chosen when the window of the operational amplifier 4 scans the positive half wave of the received signal, and values Neg1 and Neg2 representing voltage DAC1 and DAC2 when the window of the operational amplifier 4 scans the negative half wave of the received signal. Thus the change in voltage DAC1 and DAC2 ratio used in further process of the present solution is ensured by change of both these values, which allows signal shifting in a wider range than in an arrangement where one of these values stays constant.

Searching for optimum values of Pos1, Pos2, Neg1 and Neg2 is performed by a gradual change of voltage DAC1 and DAC2 using binary search. This algorithm is based on the principle of comparing a candidate of the searched value with the median of arranged series of elements and determining the half of the interval in which the searched value cannot appear. The calibration is performed in such way that optimum values Pos1 and Pos2, or Neg1 and Neg2, are simultaneously determined, wherein the order of operations is not decisive for further function of the present solution; however, the calibration output must include all four searched optimum values. Of course, it is not possible to determine optimum values, one of which corresponds to the setting of the reading window of the operational amplifier 4 for processing the positive half wave and the other corresponds to the setting of the reading window of the operational amplifier 4 for processing the negative half wave, i.e., for example, Pos1 and Neg2, or Pos2 and Neg1. In a preferred embodiment the values Pos1, Pos2, Neg1 and Neg2 are chosen so that the mean value of the useful signal is in the center of the area intended for conversion by the AD converter 5.

After performing each of the above-mentioned calibration procedures, it is possible to perform the processing of the RFID chip 1 signal. The first DA converter 6 and further the second DA converter 7 or the source of constant voltage are controlled by DMA (Direct Memory Access) and are configured so that in the first channel 8 at a required moment voltage DAC1 is set to a Pos1 or Neg1 value depending on whether at the given moment it is desired for the reading window of the operational amplifier 4 to scan positive or negative half wave of the received signal. In the second channel DMA 9 voltage DAC2 is at the same time set to a Pos2 or Neg2 value, wherein for the correct shift of the reading window of the operational amplifier 4 it is necessary that only pairs of values of Pos1 and Pos2, or Neg1 and Neg2, are at the same time set in the individual channels DMA 8,9, according to the performed calibration.

Both channels DMA 89 are further configured to a circular continual mode which ensures regular change of voltage DAC1 and DAC2 for the shift of the reading window of the operational amplifier 4 to a position of the specific maximum, so that the positive and negative peak are alternately processed by the AD converter 5, since pulses corresponding to the transferred information of the RFID chip 1 are detected in positive and negative half waves. Each channel DMA 8,9 includes only two voltage values which are alternately applied in regular intervals, wherein in the case of the first channel DMA 8, which corresponds to the voltage DAC1, these are the values Pos1 and Neg1, and in the case of the second channel DMA 9, which corresponds to the voltage DAC2, these are the values Pos2 and Neg2. The change in the ratio of voltage DAC1 and DAC2 is preferably ensured by the change of both of these values, which allows shifting the signal in a wider range than in the arrangement where one of these values stays constant.

The AD converter 5 is configured to continuously alternately process positive and negative peaks of the input signal, wherein the synchronization of the AD converter 5 with the first DA converter 6 and further with the second DA converter 7 or the source of constant voltage, the outputs of which are connected individually to the inverting and the non-inverting input of the operational amplifier 4, and with the control unit 10 for exciting the antenna 3, is performed by the synchronizing unit 11. The control unit 10 is in the preferred embodiment for example a MOSFET transistor with a push-pull output circuit. In another exemplary embodiment the antenna 3 can be excited by logical circuit gates.

After converting the signal by the AD converter 5 the amplitude of two consecutive peaks corresponding to a single wave is subtracted, wherein the individual signals are temporarily stored in the buffer 12 before subtraction. The final digitally processed signal is subsequently stored in the data structure, specifically in the queue 13 to prevent data overflow.

In an exemplary embodiment of the invention according to FIG. 1 the reader 2 comprises, in order to perform the method of processing the signal of the passive RFID chip 1 the antenna 3 adapted to transmit the source signal and detect the signal of the passive RFID chip 1, the control unit 10 electrically connected to the antenna 3 and adapted to excite the antenna 3, the first DA converter 6 and further the second DA converter 7 or the source of constant voltage, the synchronizing unit 11, the AD converter 5 and the operational amplifier 4 connected as a summing amplifier. The synchronizing unit 11 is electrically connected with the first DA converter 6 and further with the second DA converter 7 or the source of constant voltage, the control unit 10 and the AD converter 5 and adapted to time synchronize all components with which it is directly and/or indirectly electrically connected, wherein the outputs of the antenna 3 and the first DA converter 6 are fed to the inverting input of the operational amplifier 4, the output of the second DA converter 7 or the source of constant voltage is fed to the non-inverting input of the operational amplifier 4 and the output of the operational amplifier 4 is fed to the input of the AD converter 5.

The scheme of the connection of the reader 2 for performing the method of processing the signal of the passive RFID chip 1, shown in FIG. 1, also includes, in addition to the above-mentioned components, an MCU (Microcontroller Unit) unit 14, with an integrated first DA converter 6 and further a second DA converter 7 or a source of constant voltage, corresponding DMA channels 8,9 configured to calibrated values Pos1, Pos2, Neg1 and Neg2 for controlling the first DA converter 6 and further the second DA converter 7 or the source of constant voltage, an AD converter 5, a synchronizing unit 11 for time synchronization of all components with which it is directly and/or indirectly electrically connected, further a buffer 12 for temporary storing of output data of the AD converter 5 before its subtraction and a queue 13 in which the final digitally processed signal is stored to prevent data overflow.

Figure 2:
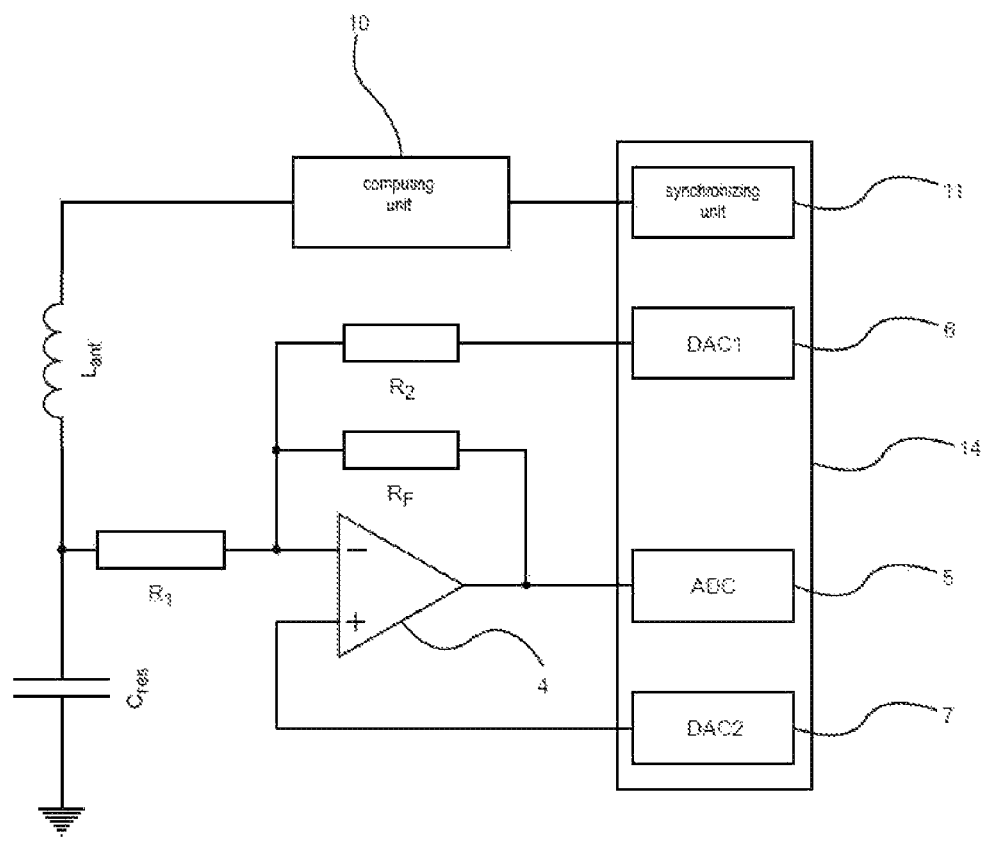
FIG. 2 shows a schematic representation of connection of a summing operational amplifier to the resonant antenna circuit and individual components integrated in the MCU unit.

In addition to the MCU unit 14, a control unit 10, an antenna 3 and an operational amplifier 4 as well as an adaptation member connected at the output of the operational amplifier 4 are connected. The connection of the summing operational amplifier 4 to the resonant circuit of the antenna 3 and to the individual components integrated in the MCU unit 14 is shown in FIG. 2. In an exemplary embodiment of the invention according to FIG. 2 the radiofrequency electromagnetic field is excited by the antenna 3 by the control unit 10, controlled from the synchronizing unit 11.

The resonant circuit of the antenna 3 comprises a condenser with the capacity $C_{res}$ ideally in the range of values of 1-4 nF and a coil with the inductance $L_{ant}$, ideally in the range of values of 600-650 µH, wherein the acceptable inductance in this exemplary embodiment is at least 400 µH, and applicable in practice not more than 1620 µH. The optimum value of capacity $C_{res}$ depends on the antenna 3 inductance and it is chosen from the mentioned interval in such way that the resonant frequency of the antenna 3 is 125 kHz. Other characteristics of the resonant circuit is voltage at the antenna 3 and a factor of antenna 3 quality. The optimum voltage value at the antenna 3 is in this exemplary embodiment about 60 V, however, for vast majority of technologies in this antenna 3 configuration, voltage of 40 V is fully sufficient. Increase in voltage may lead to increasing of the factor of antenna 3 quality, the optimum value of which is around the value 4, however, the value of 10 is also fully sufficient.

The received signal of the RFID chip 1 is subsequently fed to a resistor with resistance $R_1$, ideally in the range of 80-120 kΩ, wherein the reliable functioning of the device is in this exemplary embodiment also ensured in a wider range of values of 20-200 kΩ, and further to the inverting input of the operational amplifier 4, wherein the output of the first DA converter 6 is also fed to the inverting input of the operational amplifier 4 via the resistor with resistance $R_2$, ideally in the range of values of 2-10 kΩ, while the output of the second DA converter 7 or the source of constant voltage is fed to the non-inverting input of the operational amplifier 4. The operational amplifier 4 is connected in a functional connection of the summing amplifier, and comprises the resistor $R_F$, ideally of the same resistance value as the resistor $R_1$, in a feedback branch interconnecting the inverting input of the operational amplifier 4 with the output of the operational amplifier 4. The minimum value of the resistor $R_2$ is practically determined by load capacity of the first DA converter 6 and the minimum value of resistors $R_1$ and $R_F$ is given by the limitation for the maximum current by protection diodes of the operational amplifier 4. The values of resistors $R_1$ and $R_F$ are determined in relation to the chosen value of resistor $R_2$ so that the final signal shift corresponds with the voltage at the antenna 3. The output of the operational amplifier 4 is fed to the input of the AD converter 5 integrated in the MCU unit 14.

In an exemplary embodiment of the invention the operational amplifier 4 has the slew rate of at least 4 V/µs and broadband with a value of at least 8 MHz. However, the invention is not limited to the use of only these parameter values of the operational amplifier 4.

Exemplary use of the device and the method of processing the signal of the passive RFID chip 1 according to this invention is as follows. The reader 2 for processing the signal is a part of a multifunction printer. A user of the printer places a card with the RFID chip 1 on the reader 2 of RFID chips 1. The reader 2 reads information saved on this card. The information may include, for example, user s identification number, their working position, authorization, availability of printing jobs for the given user, etc. Using the method of signal processing according to this invention helps to achieve more reliable and more accurate reading of data, particularly when using RFID chips 1 transmitting a phase modulated signal. In an exemplary embodiment of the invention the parameter values of electrical components in the circuit in FIG. 2 are given as $L_{ant}$=630 µH, the value of condenser capacity $C_{res}$ can be chosen in the interval of 1.89-3.16 nF and the values of resistors $R_1$ and $R_2$ then take values of 100 kΩ and 4.7 kΩ, wherein the value of resistor $R_F$ should be identical to the value of resistor $R_1$. The value of resistance of resistor $R_1$ has to be then chosen with respect to the protection diode of the input of the operational amplifier 4. The value of resistance of resistor $R_2$ has to be then chosen with respect to the load capacity of the first DA converter 6 based on its datasheet. The value of amplification of the operational amplifier 4 is then obtained from the values of resistance of these resistors. However, the invention is not limited to the use of these values, these values are only exemplary. In an exemplary embodiment of the invention a planar antenna 3 from a six-layer printed circuit is chosen as the antenna 3. The same printed circuit comprises simultaneously a low-frequency (LF) and a high-frequency (HF) antenna 3. The advantage of this embodiment lies in a simple manufacture thereof. In addition, the antenna 3 of this type requires no manual assembly, which reduces production complexity and increases the reliability of the device. The specific optimum value of the antenna 3 inductance is therefore given by construction parameters, or the device dimensions. In general, the device reliability increases with higher inductance L. The coefficient of antenna 3 quality Q is in the exemplary embodiment chosen to be 10, optionally 4. However, the specific value of the parameter Q depends on the value of internal inductance and the series resistance of the antenna 3. In the exemplary embodiment with parameters as mentioned above, which is not limiting to other potential embodiments of the invention, the antenna 3 is chosen for voltage at the resonance of 40 V. The value of condenser capacity $C_{res}$ is then chosen so that the resonant frequency of the circuit is 125 kHz.

Based on the above-mentioned it is apparent that the setting of the optimum parameters is as follows. An antenna 3 with a certain value of internal inductance L is chosen. It is assigned a resonant condenser and the value of the capacity thereof is chosen so that the resonant frequency is 125 kHz for the minimum voltage at the antenna 3 and the corresponding Q. The value of $R_2$ is determined by the load capacity of the first DA converter 6. The values $R_1$ and $R_F$ are then given by the maximum current passing through the protection diodes of the operational amplifier 4.

In another exemplary embodiment the first DA converter 6 or the second DA converter 7 or the source of constant voltage can be replaced by a PWM (Pulse Width Modulation) channel with a filter designed as a low-pass filter. However, placing the filter to the PWM output slows down the signal and introduces undesirable bias, and it is also very difficult, in this exemplary embodiment, to process signal of the positive and negative half waves at the same time (the so-called two peak sampling).

INDUSTRIAL APPLICABILITY

A device according to this invention can be used to improve quality of data transfer from a LF RFID chip, which is for example in identification cards for attendance records, for identification of components in device during production, or for contactless authorization for devices, such as printers or photocopiers.

LIST OF REFERENCE SIGNS

1—RFID chip
2—reader
3—antenna
4—operational amplifier
5—AD converter
6—first DA converter 7—second DA converter
8—first channel DMA
9—second channel DMA
10—control unit
11—synchronizing unit
12—buffer
13—queue
14—MCU

The invention claimed is:

1. A method of processing a signal of a passive RFID chip with a reader comprising an antenna, an operational amplifier, an AD converter and a first DA converter and further a second DA converter or a source of constant voltage, consisting of steps of transmitting the source signal of the antenna, receiving the source signal of the antenna by the RFID chip, transmitting the RFID chip signal and receiving the RFID chip signal by the antenna, wherein
- a received RFID chip signal and an output of the first DA converter are fed to a inverting input of the operational amplifier,
- an output of the second DA converter or an output of the source of constant voltage is fed to a non-inverting input of the operational amplifier,
- a first pair of values of voltage of the first and the second DA converter or the source of constant voltage is chosen, wherein this pair of values is chosen so that a window of the operational amplifier scans a positive half wave of the received signal,
- a second pair of values of voltage of the first and the second DA converter or the source of constant voltage is chosen, wherein this pair of values is chosen so that the window of the operational amplifier scans a negative half wave of the received signal,
- pulses corresponding to a transferred information of the RFID chip are detected in positive and negative half waves,
- the final signal is fed to the AD converter,
- pulses detected from the same wave are subtracted.

2. The method of processing the signal of the passive RFID chip with the reader according to claim 1, wherein the values of voltage of the first and the second DA converter or the source of constant voltage are chosen so that the mean value of the useful signal is in the center of the area intended for conversion by the AD converter.

3. The method of processing the signal of the passive RFID chip with the reader according to claim 1, wherein the digitally processed signal is stored in a queue (13).

4. A reader for performing the method of processing the signal of the passive RFID chip according to claim 1, comprising an antenna adapted to transmit a source signal and detect a signal of the passive RFID chip, a control unit electrically connected to the antenna and adapted to excite the antenna, a first DA converter and further a second DA converter or a source of constant voltage, a synchronizing unit, an AD converter and an operational amplifier, wherein the synchronizing unit is electrically connected with the first DA converter and further with the second DA converter or the source of constant voltage, the control unit and the AD converter, and adapted to time synchronize all components with which it is directly and/or indirectly electrically connected, wherein the outputs of the antenna and the first DA converter are fed to an inverting input of the operational amplifier, an output of the second DA converter or the source of constant voltage is fed to a non-inverting input of the operational amplifier and an output of the operational amplifier is fed to an input of the AD converter, wherein the operational amplifier is connected as a summing operational amplifier.

5. The reader of the passive RFID chip signal according to claim 4, wherein the output of the operational amplifier is of a rail-to-rail type.

6. The reader of the passive RFID chip signal according to claim 4, wherein the control unit comprises a transistor of a push-pull MOSFET type.

* * * * *